(12) United States Patent
Chang

(10) Patent No.: US 7,220,178 B2
(45) Date of Patent: May 22, 2007

(54) RECEIVING SLOT FRAME WITH FAN

(75) Inventor: Chih-Chen Chang, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 195 days.

(21) Appl. No.: 10/968,159

(22) Filed: Oct. 20, 2004

(65) Prior Publication Data

US 2006/0084375 A1    Apr. 20, 2006

(51) Int. Cl.
*H05K 5/00* (2006.01)
(52) U.S. Cl. .................... 454/184; 361/696; 361/695
(58) Field of Classification Search ............... 454/184, 454/275; 361/695, 696; 165/80.3, 122, 165/104.33
See application file for complete search history.

(56) References Cited

U.S. PATENT DOCUMENTS 5,460,441 A * 10/1995 Hastings et al. ............ 312/298
5,514,036 A * 5/1996 Lin ............................. 454/184
5,673,029 A * 9/1997 Behl et al. ................... 340/635
6,011,701 A * 1/2000 Kopp et al. .................. 361/818
6,074,296 A * 6/2000 Wu ............................. 454/184
6,520,851 B1 * 2/2003 Shih ............................ 454/184
6,549,406 B1 * 4/2003 Olesiewicz et al. ......... 361/695
6,565,163 B2 * 5/2003 Behl et al. ................ 312/223.1
6,805,626 B2 * 10/2004 Chen ........................... 454/184

* cited by examiner

*Primary Examiner*—Derek S. Boles
(74) *Attorney, Agent, or Firm*—Bacon & Thomas, PLLC

(57) ABSTRACT

The present invention is to provide a case comprising a frame having at least one bending section each provided at its rear proximate its bottom, the bending section being formed by bending an extension of the bottom of the case upward so as to form a distance between the bending section and the rear of the frame, the bending section including at least one first fastening member; and a fan secured to the frame by fastening at the first fastening member of the bending section. In response to activating the fan, fresh air is drawn into the frame or hot air inside the frame is driven out. By utilizing the present invention, ventilation is realized with heat generated by the electronic and electrical components in the case being sufficiently dissipated.

5 Claims, 3 Drawing Sheets

RECEIVING SLOT FRAME WITH FAN

FIELD OF THE INVENTION

The present invention relates to computer or server cases and more particularly to such a computer or server case having an improved receiving slot frame structure for mounting a fan thereon.

BACKGROUND OF THE INVENTION

We have entered a new era of high technology. More and more advanced electronic products (e.g., personal computers or servers such as blade servers) are being widely used in our daily life. A number of data storage devices (e.g., CD-ROMs, floppy disk drives, etc.) and electronic components (e.g., CPU (central processing unit), image processing chips, etc.) are installed in a computer or server. It is understood that heat will be generated by parts (e.g., resistors, capacitors, inductors, semiconductor chips, etc.) of the electronic components and the data storage devices due to current flow when they are operating. However, the computer or the server including its data storage devices and electronic components may not operate normally if its internal temperature is higher than the operating temperature due to poor ventilation. Thus, it is important to maintain temperature of the data storage devices and the electronic components below the operating temperature so as to ensure a normal operation of the computer or the server. In view of the above, it is critical to sufficiently dissipate heat when an electronic device is operating. Otherwise, both stability and durability of the device may be deteriorated. Accordingly, many companies and institutions have developed a variety of devices for solving the serious problem of heat accumulation in an operating computer or server.

Conventionally, a fan is installed in a computer or server for dissipating heat when it is operating. In brief, the fan is adapted to set up a current of air for either drawing fresh air into the computer or the server or driving out hot air caused by the operating electronic components. As an end, the computer or the server may operate normally due to decreased internal temperature.

Frame 10 of a receiving slot in a conventional computer or server is shown in FIG. 1. Within the parallelepiped frame 10 there are provided a space 11 for installing at least one of data storage devices (e.g., hard disk drive) 101, at least one of electrical components (e.g., transformer) 102, and a printed circuit board (e.g., motherboard) 103. The frame 10 is adapted to absorb electromagnetic noise generated by the operating data storage devices 101 and electrical components 102. Otherwise, electromagnetic noise may transmit beyond the frame 10 to adversely affect external electrical or mechanical devices, animals, etc. Also, electromagnetic noise is prohibited from entering the frame 10. Otherwise, operation of the above data storage devices 101, the electrical components 102, and other parts may be interfered undesirably. In brief, the frame 10 is adapted to prevent EMI (electromagnetic interference) from occurring.

Moreover, the frame 10 is constructed to prevent foreign objects (e.g., dust, insects, or the like) from entering to stay attached to the internal parts. As a result, interior of the frame 10 can be maintained clean. In addition, short-circuit is prevented from occurring in the printed circuit board 103 since humid foreign objects are prohibited from entering the frame 10.

Additionally, heat will be generated by the data storage devices 101 and electrical components 102 when they are operating. Internal temperature of the frame 10 will increase quickly due to heat accumulation therein. For decreasing temperature, a plurality of fans (two are shown) 12 are provided in the space 11. The fans 12 are adapted to operate after power has been fed from a power supply (not shown) in the frame 10. As stated above, the fans 12 are adapted to set up a current of air for either driving out hot air, caused by the accumulated heat, from the data storage devices 101 and the electrical components 102. As a result, internal temperature of the frame 10 can be decreased quickly to a value below the predetermined operating temperature.

Referring to FIG. 1 again, there is provided a rectangular mounting plate 13 in the frame 10. Two ends of the mounting plate 13 are coupled to opposite sides of the space 11. As a result, the mounting plate 13 is fastened in the frame 10. Four threaded holes 131 arranged in the form of rectangle are provided in the mounting plate 13 proximate the electrical components 102. Four apertures 121 are provided in four corners of the fan 12 in which each aperture 121 corresponds to the threaded hole 131. A plurality of (e.g., four) screws 122 are adapted to drive through the apertures 121 into the threaded holes 131 for securing the fan 12 to the mounting plate 13. In operation, each of the activated fans 12 is adapted to set up a current of air toward the data storage devices 101 or the electrical components 102. As a result, heat generated by the data storage devices 101 or the electrical components 102 can be quickly driven out.

However, the prior art suffered from several disadvantages. For example, in the installation four screws 122 are driven through the apertures 121 into the threaded holes 131 for securing the fan 12 to the mounting plate 13. Also, the mounting plate 13 is then secured to the space 11. Such installation may require an excessive number of screws 122, resulting in an increase in the manufacturing cost. Further, the provision of the mounting plate 13 can complicate the assembly and thus contradicts the trend of easy assembly/disassembly, cost effective, and easy and quick replacement of malfunctioned components of information products. Thus, it is desirable to provide a computer or server case having an improved receiving slot frame structure for mounting a fan thereon.

SUMMARY OF THE INVENTION

After considerable research and experimentation, a case (e.g., computer or server case) having a novel receiving slot frame for mounting a fan thereon according to the present invention has been devised so as to overcome the above drawback of the prior art.

It is an object of the present invention to provide a case comprising a frame comprising at least one bending section each provided at its rear proximate its bottom, the bending section being formed by bending an extension of the bottom of the case upward so as to form a distance between the bending section and the rear of the frame, the bending section including at least one first fastening member; and a fan secured to the frame by fastening at the first fastening member of the bending section. In response to activating the fan, fresh air is drawn into the frame or hot air inside the frame is driven out. By utilizing the present invention, ventilation is realized with heat generated by the electronic and electrical components in the case being sufficiently dissipated.

The above and other objects, features and advantages of the present invention will become apparent from the following detailed description taken with the accompanying drawings.

DETAILED DESCRIPTION OF THE PREFERRED EMBODIMENTS

Figure 1:
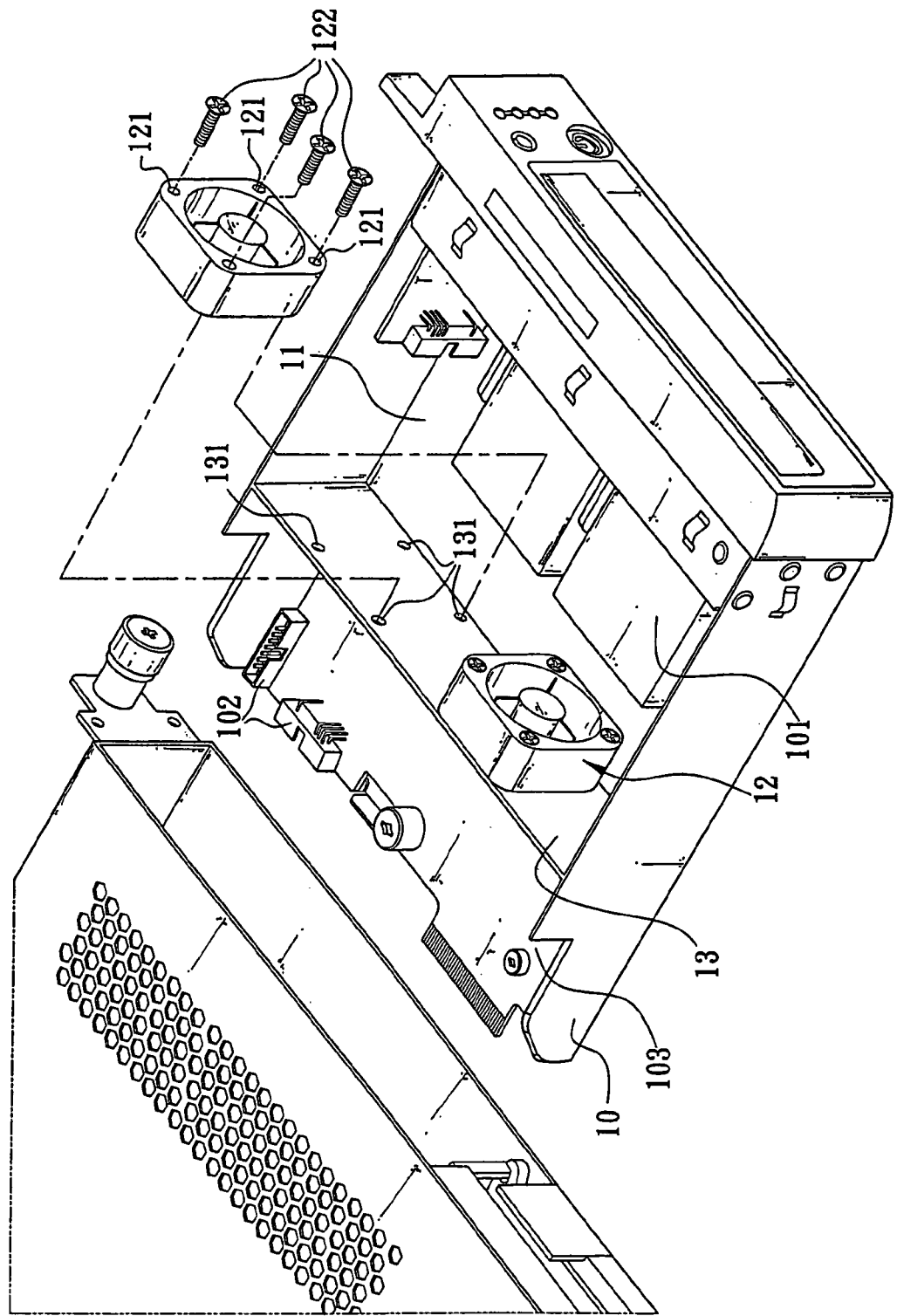
FIG. 1 is an exploded, perspective view of a receiving slot in a conventional computer or server case with two fans mounted thereon.
Figure 2:
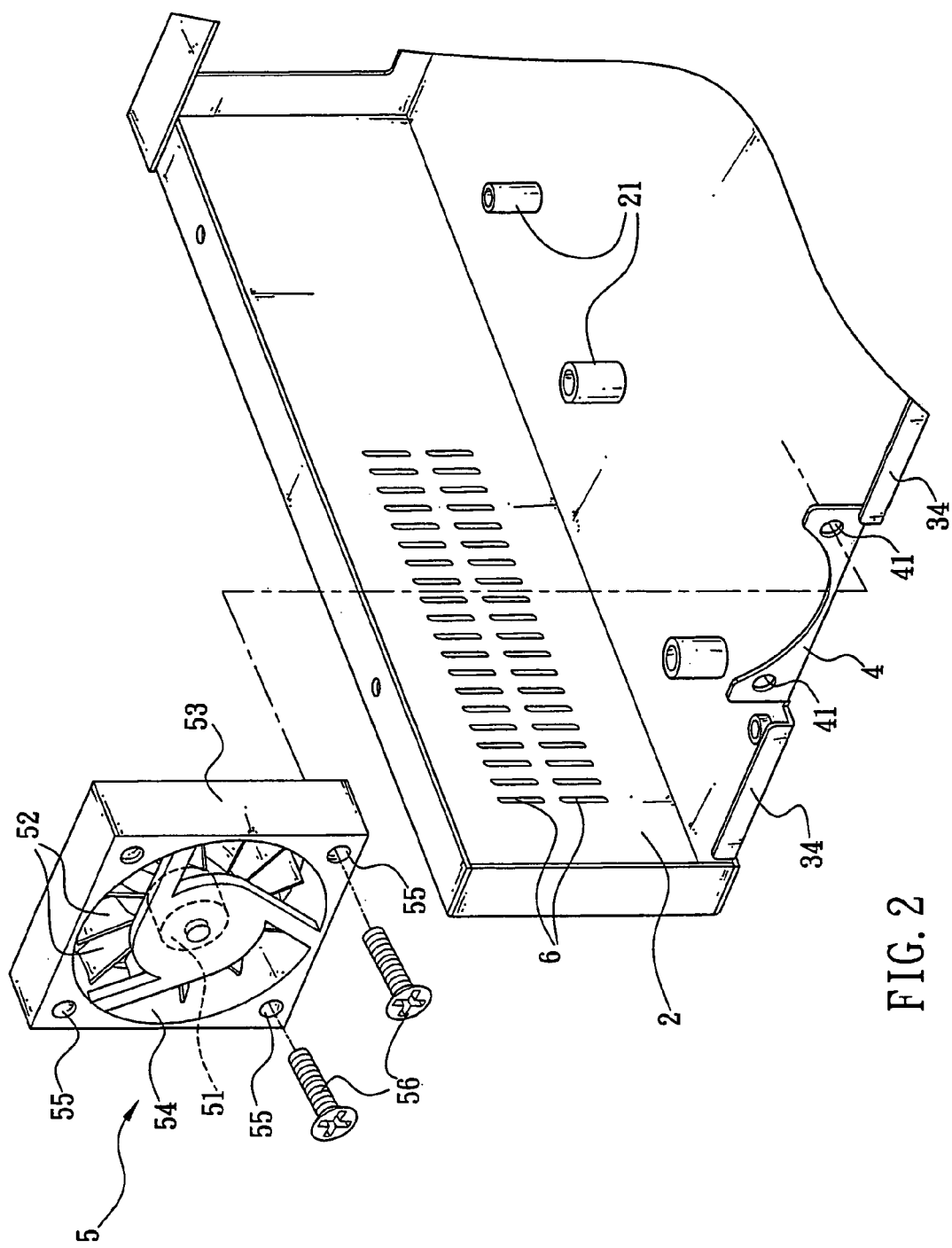
FIG. 2 is an exploded, partial, perspective view of a preferred embodiment of the frame of a receiving slot in a computer or server according to the invention.

Referring to FIG. 2, there is shown a substantially parallelepiped frame 2 of a receiving slot in a computer or server in accordance with a preferred embodiment of the invention. The frame 2 comprises at least one bending section 4 on a rear adjacent its bottom. The bending section 4 is formed by bending an extension of the bottom of the frame 2 upward. A distance is formed between the bending section 4 and the rear of the frame 2, i.e., the bending section 4 is recessed with respect to the rear of the frame 2. A fan (e.g., computer fan) 5 is provided on the bending section 4. One surface of the fan 5 facing the frame 2 is disposed in the frame 2 and the other surface thereof is projected outward. Fresh air is drawn into the frame 2 when the fan 5 rotates clockwise. Alternatively, hot air inside the frame 2 is driven out of the frame 2 when the fan 5 rotates counterclockwise. As an end, ventilation is realized with heat generated by the electronic and electrical components in the frame 2 being well dissipated.

Referring to FIG. 2 again, the fan 5 comprises a parallelepiped-shaped fan casing 53, lengthwise, hollow cylinder 54 in the center of the fan casing 53, a motor 51 provided in the cylinder 54, a plurality of blades 52 formed integrally with the motor 51, and four threaded holes 55 each extended from one corner at one surface of the fan casing 53 to one corresponding corner at the other surface thereof. The bending section 4 comprises two first fastening portions 41 (e.g., two apertures at both ends facing a center of the frame 2) being disposed corresponding the threaded hole 55. In installation, align the fan 5 with the bending section 4 toward center of the frame 2. Next, align the first fastening members 41 with the threaded holes 55 prior to driving fasteners (e.g., screws) 56 from external of the frame 2 through the first fastening members 41 into the corresponding threaded holes 55. As an end, the fan 5 is secured to the frame 2. Moreover, top edge of the bending section 4 (i.e., edge opposing the bottom of the frame 2) is concave. The motor 51 in the cylinder 54 is activated to cause the blades 52 to rotate in response to being electrically energized. In this case, current of air set up by the fan 5 will not be hindered by the bending section 4.

Referring to FIG. 2 again, a plurality of ventilating slits 6 are provided on either side of the frame 2. In one state, a positive pressure zone is formed inside the frame 2 when external air is drawn into the frame 2 by the operating fan 5. At the same time, hot air is driven out of the frame 2 through the ventilating slits 6. In another state, a negative pressure zone is formed inside the frame 2 when external air is driven out of the frame 2 by the operating fan 5. At the same time, fresh air is drawn into the frame 2 through the ventilating slits 6. By the provision of the ventilating slits 6, ventilation of the frame 2 can be realized, resulting in a quick heat dissipation.

Figure 3:
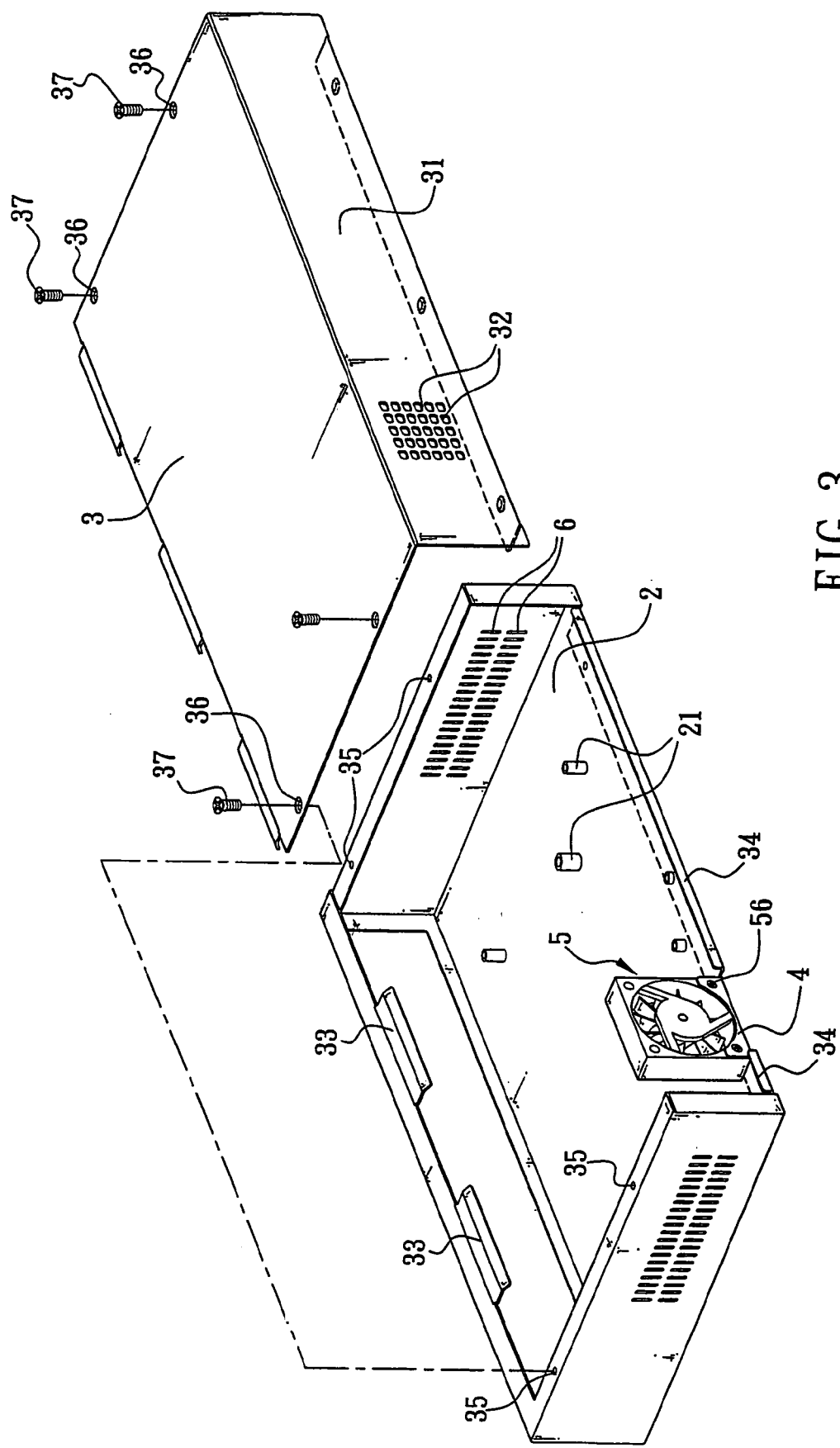
FIG. 3 is a perspective view depicting the frame of the receiving slot to be coupled to a cover.

Referring to FIG. 3, a plurality of second fastening members (e.g., threaded posts) 21 are formed on a bottom of the frame 2. A member (e.g., motherboard or power supply) is secured to the second fastening members 21 prior to mounting in the frame 2. For example, there are two apertures on the motherboard in which each aperture corresponds to the second fastening member 21. Screws are adapted to drive through the apertures into the second fastening members 21 for fastening the motherboard in the frame 2.

Referring to FIG. 3 again, in a preferred embodiment of the invention there is further provided a cover 3 having a section of L. The cover 3 is adapted to snugly put onto a top and the rear of the frame 2 for enclosing electronic and electrical components including the fan 5 in the frame 2. The cover 3 comprises a rear baffle plate 31 extended toward the bottom of the frame 2 proximate an outer surface of the bending section 4. The baffle plate 31 is adapted to cover an outer surface of the fan 5 distal the frame 2. Moreover, a plurality of ventilating slits 32 are provided on the baffle plate 31 and are disposed in a corresponding relationship to the fan 5. The ventilating slits 32 are aesthetic and are adapted to cover the air exit of the fan 5 while permitting a free air flow therethrough. As an end, excessive heat inside the frame 2 can be dissipated quickly.

Referring to FIG. 3 again, a plurality of latches 33 are provided on top of the front of the frame 2. The latch 33 is a conductive piece (e.g., metal piece) and has one end coupled to top of the front of the frame 2. The other open ends of the latches 33 contact the surface of the cover 3 facing top of the frame 2 when the cover 3 is put on the frame 2. The frame 2 can be formed of a conductive material (e.g., galvanized iron). Thus, an enclosed space is formed by the coupled frame 2 and the cover 3 and thus electromagnetic noise is prevented from occurring.

Referring to FIG. 3 again, two conductive flanges 34 sandwiching the bending section 4 are extended along the rear edge of the frame 2 with its tops facing the cover 3. The flanges 34 are engaged with the baffle plate 31 when the cover 3 and its baffle plate 31 are coupled to the frame 2. As a result, electromagnetic noise is prevented from leaving the frame 2 via gaps between the baffle plate 31 and the frame 2.

Referring to FIG. 2 again, a plurality of third fastening members (e.g., threaded holes) 35 are provided on top of either side of the frame 2 facing the cover 3. Correspondingly, a plurality of holes 36 are provided on either side of the cover 3. A plurality of screws 37 are driven through the holes 36 into the third fastening members 35 in response to putting the cover 3 onto the frame 2. As an end, the cover 3 and the frame 2 are secured together.

While the invention herein disclosed has been described by means of specific embodiments, numerous modifications and variations could be made thereto by those skilled in the art without departing from the scope and spirit of the invention set forth in the claims.

What is claimed is:

1. A case comprising:

a frame comprising at least one bending section each disposed at its rear proximate its bottom, the bending section being formed by bending an extension of the bottom of the frame upward so as to form a distance between the bending section and the rear of the frame, the bending section including at least one first fastening portion and a concave top edge opposing the bottom of the frame;

a fan secured to the frame by fastening at the first fastening portion of the bending section, the fan comprising a parallelepiped-shaped fan casing and a plurality of threaded holes each extended from one corner at one surface of the fan casing to one corresponding corner at the other surface thereof such that a threaded fastener is adapted to drive through the first fastening portion into the corresponding threaded hole for securing the fan to the frame;

a cover adapted to snugly put onto a top and the rear of the frame, the cover including a baffle plate extended toward the bottom of the frame to be proximate an outer surface of the bending section for covering the frame and the fan.

2. The case of claim 1, further comprising a plurality of ventilating slits disposed on the baffle plate.

3. The case of claim 2, further comprising at least one latch disposed on a top of a front of the frame extended toward a center of the frame.

4. The case of claim 2, further comprising two conductive flanges sandwiching the bending section and extended upward from the frame toward the cover.

5. The case of claim 2, wherein the frame further comprises:
  a plurality of third fastening members on either side of its top;
  a plurality of holes disposed on either side of the cover, each hole being disposed in a corresponding relationship to the third fastening member; and
  a plurality of screws adapted to drive through the holes into the third fastening members for securing the cover to the frame.

* * * * *